United States Patent
Park

[11] Patent Number: 5,875,147
[45] Date of Patent: Feb. 23, 1999

[54] ADDRESS ALIGNMENT SYSTEM FOR SEMICONDUCTOR MEMORY DEVICE

[75] Inventor: Soung Hwi Park, Chungcheongbuk-do, Rep. of Korea

[73] Assignee: LG Semicon Co., Ltd., Chungcheongbuk-Do, Rep. of Korea

[21] Appl. No.: 870,297

[22] Filed: Jun. 6, 1997

[30] Foreign Application Priority Data

Jul. 31, 1996 [KR] Rep. of Korea ................. 31642/1996

[51] Int. Cl.$^6$ ........................................ G11C 8/00
[52] U.S. Cl. ............................ 365/230.01; 395/425
[58] Field of Search ................ 395/425; 365/230.01, 365/230.03

[56] References Cited

U.S. PATENT DOCUMENTS

| | | | |
|---|---|---|---|
| 5,138,705 | 8/1992 | Lo et al. ................................. | 395/425 |
| 5,353,427 | 10/1994 | Fujishima et al. ..................... | 395/425 |
| 5,367,495 | 11/1994 | Ishikawa ............................. | 365/230.03 |
| 5,561,784 | 10/1996 | Chen et al. ............................. | 395/484 |
| 5,634,038 | 5/1997 | Saitoh ..................................... | 395/490 |

OTHER PUBLICATIONS

Intel 80960CA Product Overview (Sep. 1989), pp. 3–187.

*Primary Examiner*—David Nelms
*Assistant Examiner*—M. Tran
*Attorney, Agent, or Firm*—Morgan, Lewis & Bockius LLP

[57] ABSTRACT

An address alignment system for a semiconductor memory device includes a plurality of address decoders for decoding a received address, dividing m cells of n bit size into at least two blocks, and individually accessing the cells on the block basis; a controlling circuit for producing data input/output selection signals according to the received address; a plurality of cell selectors connected to cells on the same row of the blocks for selecting cells in any one block in response to the data input/output selection signals produced by the controlling circuit; a plurality of input/output selectors for selecting one of the cell selectors to re-align data in the order of addresses according to the data input/output selection signals produced by the controlling circuit; and a plurality of input/output ports each connected to one of the input/output selectors.

7 Claims, 3 Drawing Sheets

FIG.3

| input address | | | selection signal for de-multiplexer having two inputs | | | | selection signal for de-multiplexer having four inputs | |
|---|---|---|---|---|---|---|---|---|
| A2 | A1 | A0 | S0 | S1 | S2 | S3 | SU1 | SU0 |
| ∅ | ∅ | ∅ | ∅ | ∅ | ∅ | ∅ | ∅ | ∅ |
| ∅ | ∅ | 1 | 1 | ∅ | ∅ | ∅ | ∅ | 1 |
| ∅ | 1 | ∅ | 1 | 1 | ∅ | ∅ | 1 | ∅ |
| ∅ | 1 | 1 | 1 | 1 | 1 | ∅ | 1 | 1 |
| 1 | ∅ | ∅ | 1 | 1 | 1 | 1 | ∅ | ∅ |
| 1 | ∅ | 1 | ∅ | 1 | 1 | 1 | ∅ | 1 |
| 1 | 1 | ∅ | ∅ | ∅ | 1 | 1 | 1 | ∅ |
| 1 | 1 | 1 | ∅ | ∅ | 1 | 1 | 1 | 1 |

1

ADDRESS ALIGNMENT SYSTEM FOR SEMICONDUCTOR MEMORY DEVICE

BACKGROUND OF THE INVENTION

1. Field of the Invention

The present invention relates to an address alignment system, and more particularly, to an address alignment system for a semiconductor memory device.

2. Discussion of the Related Art

Generally, a semiconductor memory device uses memory elements and a decoder for selecting memory words, together with memory cells, designated by input addresses.

A conventional decoder for the semiconductor memory device will be discussed with reference to the attached drawings. FIG. 1 is a block diagram showing a conventional decoder system for a semiconductor memory device. The conventional semiconductor memory device includes "mxn" binary memory cells 2 for accommodating "m" words of "n" bits, and an address decoder 1 for selecting each word. Each binary memory cell is a basic design block of the semiconductor memory device.

Two address inputs are connected to the address decoder 1, which is operated by a memory enable signal. If the memory enable signal sent to the address decoder 1 is "0", the output of the address decoder 1 becomes "0" so that no word can be selected. If a memory enable signal sent to the address decoder 1 is "1", one of four words is selected according to the value of the two address inputs. In this case, if a reading/writing signal is "1", storage values of a binary memory cell 2 on designated words pass through three OR gates 3 and are produced through output ports. Since other binary memory cells 2 generate "0", they don't affect the output. If the reading/writing signal is "0", information standby at an input port is stored in a binary memory cell 2 on a designated word.

In the conventional semiconductor device, if the address decoder 1 receives an address, memory cells of many bytes on the designated row are simultaneously accessed.

The conventional semiconductor memory device has the following problems. It only provides accessibility to the memory cells on a designated row upon receiving an address in an address decoder. It cannot provide continuity in input of addresses. Therefore, if when storing data with lengths and addresses over two rows, since the semiconductor memory device operates in divided steps for each of the rows, the operation speed is very low.

SUMMARY OF THE INVENTION

Accordingly, the present invention is directed to an address alignment system for a semiconductor memory device that substantially obviates one or more of the problems due to limitations and disadvantages of the related art.

An object of the present invention is to provide an address alignment system which can access many bytes of continued memory cells for any selected address.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the address alignment system for a semiconductor memory device of the present invention includes a plurality of address decoders for decoding addresses, dividing m cells of n bit size into at least 2 blocks of axb size, and individually accessing the cells on the block basis, controlling means for producing data input/output selection signals according to received addresses, "a" number of cell selecting means connected to cells on the same row of the blocks in common for selecting cells in any one block in response to the data input/output selection signal produced by the controlling part, "a" number of input/output selectors each selecting one of the cell selectors to re-align data in the order of addresses according to a data input/output selection produced by the controller, and "a" number of input/output ports each connected to one of the input/output selectors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a truth table in accordance with operations of the address alignment system of the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
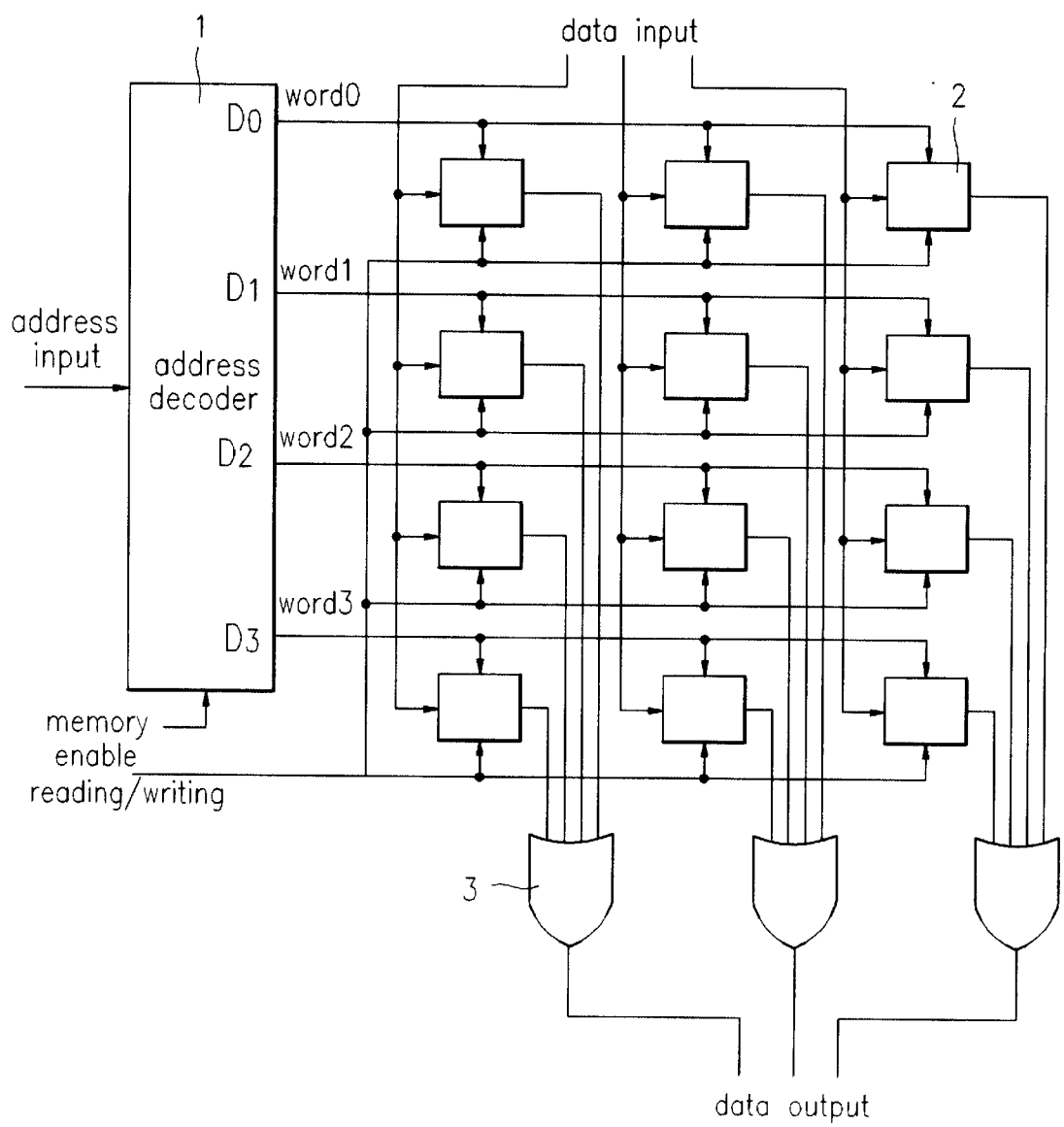
FIG. 1 is a block diagram of a conventional decoder system for a semiconductor memory device.
Figure 2:
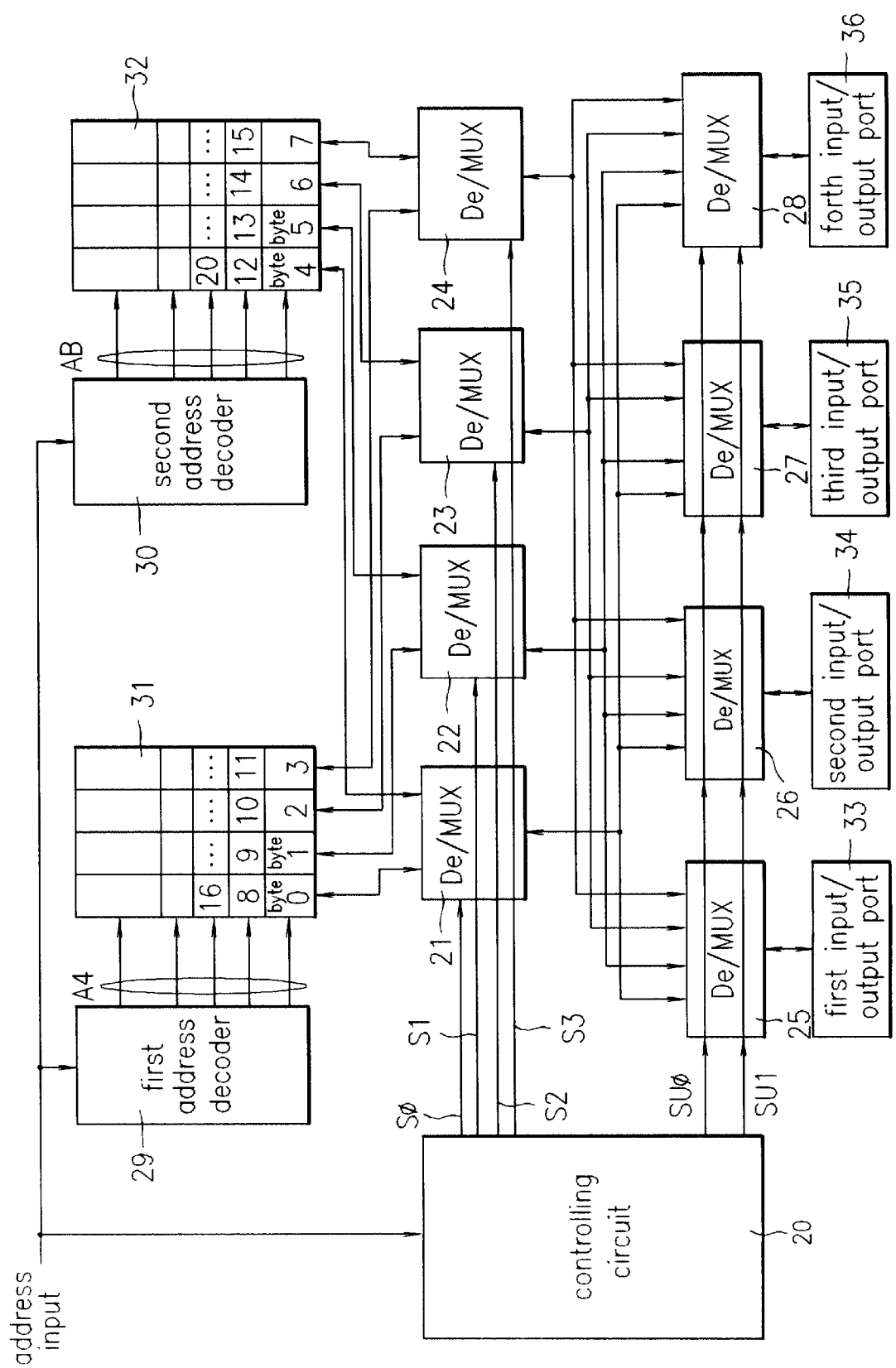
FIG. 2 is a block diagram of an address alignment system in accordance with a preferred embodiment of the present invention.

FIG. 2 is a block diagram showing an address alignment system in accordance with a preferred embodiment of the present invention, and FIG. 3 is a truth table in accordance with the operations of the address alignment system of the present invention.

In the semiconductor memory device of the present invention, memory cells for storing data are divided into two blocks, each having 4-byte sized input/output.

The address alignment system includes first and second address decoders 29 and 30 for decoding an address received by the semiconductor memory device. A first memory cell block 31 stores the addresses decoded by the first address decoder 29, and a second memory cell block 32 stores the addresses decoded by the second address decoder 30. A controlling circuit 20 generates data input/output selection signals S0, S1, S2, S3, SU0, and SU1 in accordance with the received addresses. A first two-input demultiplexer 21 is connected to the first memory cell block 31 and the second memory cell block 32 for selecting a data input/output in response to the data input/output selection signal S0 from the controlling circuit 20. A second two-input demultiplexer 22 is connected to the first memory cell block 31 and the second memory cell block 32 for selecting a data input/output in response to the data input/output selection signal S1 from the controlling circuit 20. A third two-input demultiplexer 23 is connected to the first cell memory block 31 and the second cell block 32 for selecting a data input/output in response to the data input/output selection signal S2 from the controlling circuit 20. A fourth two-input demultiplexer 24 is connected to the first memory cell block 31 and the second memory cell block 32 for selecting a data input/output in response to the data input/output selection signal S3 from the controlling circuit 20. First to fourth four-input demultiplexers 25, 26, 27, and 28 receive and produce cell data in response to the data input/output selection signals SU0 and SU1 from the controlling circuit 20. First to fourth input/output ports 33, 34, 35, and 36 receive and produce data from the first to the fourth four-input demultiplexers 25, 26, 27, and 28, respectively.

Each of the first to the fourth input/output ports 33, 34, 35, and 36 has 8 bytes of data width and can receive/produce a maximum of 32 bits of data simultaneously.

The operation of the address alignment system according to the present invention will now be described. First, upon receiving an address for access to a memory cell, the received address is decoded by both the first address decoder 29 and the second address decoder 30. Since the address is also received by the controlling circuit 20, the controlling circuit 20 generates data input/output selection signals S0, S1, S2, S3, SU0, and SU1 in accordance with the received address.

The operation of each block in accordance with each address value will be described with reference to FIG. 3. FIG. 3 shows a table of operation values, where a least significant bit (LSB) of the input address A is defined as A0, a second LSB as A1, and a third LSB as A2, etc.

If the received address is "zero," the data input/output selection signals S0, S1, S2, and S3 from the controlling circuit 20 are all "zero" so that the two-input demultiplexers 21, 22, 23, and 24 are all connected to the first memory cell block 31 in common. Because the data input/output selection signals SU0 and SU1 also become "zero", the four-input demultiplexers 25, 26, 27, 28 are connected to the input/output ports 33, 34, 35, and 36, respectively. Accordingly, reception/production of the input/output ports 33–36 are byte 0, byte 1, byte 2, and byte 3, respectively.

If the received address is unity, the data input/output selection signal S0 becomes unity so that the first two-input demultiplexer 21 is connected to the second memory cell block 32, and the data input/output selection signals S1, S2, and S3 become "zero" so that the second, third, and fourth two-input demultiplexers 22, 23, and 24 are connected to the first cell block 31. Since the data input/output selection signals SU0 and SU1 are unity and "zero" respectively, the first, second, third, and fourth four-input demultiplexers 25, 26, 27, and 28 are operated such that the input/outputs of the input/output ports 33, 34, 35, and 36 become byte 1, byte 2, byte 3, and byte 4, respectively.

If the received address is 2, the data input/output selection signals S0 and S1 become 1 so that the first and second two-input demultiplexers 21 and 22 are connected to the second memory cell block 32, and the data input/output selection signals S2 and S3 becomes "zero" so that the third and fourth two-input demultiplexers 23 and 24 are all connected to the first memory cell block 31. The data input/output signals SU0 and SU1 become 0 and 1, respectively. The first to fourth four-input demultiplexers 25–28 are operated so that the input/output of the first to the fourth input/output 33–36 become byte 2, byte 3, byte 4, and byte 5, respectively.

If the received address is 4, all the data input/output selection signals S0, S1, S2, and S3 become unity so that the first, second, third, and fourth two-input demultiplexers 21, 22, 23, and 24 are connected to the second memory cell block 32. The data input/output selection signals SU0 and SU1 become "zero". The first, second, third, and fourth four-input demultiplexers 25, 26, 27, and 28 are operated such that the input/outputs of the first, second, third, and fourth input/output ports 33, 34, 35, 36 are byte 4, byte 5, byte 6, and byte 7, respectively.

If the received address is 4, 5, 6, or 7, unity is added to the address of the first memory cell block 31 before decoding the received address. For example, if the received address is 6, the address of the first memory cell block 31 becomes byte 8 to byte 11. And, since the data input/output selection signals S0 and S1 become "zero" and the data input/output selection signals S2 and S3 become unity, the first and second two-input demultiplexers 21 and 22 are connected to the first memory cell block 31, and the third and fourth two-input demultiplexers 23 and 24 are connected to the second memory cell block 32. Since the data input/output selection signals SU0 and SU1 are "zero" and "one", the first, second, third, and fourth demultiplexers 25, 26, 27, and 28 having four inputs are operated so that the input/outputs of the first, second, third, and fourth input/output ports 33, 34, 35, and 36 become byte 6, byte 7, byte 8, and byte 9, respectively.

The address alignment system of the present invention has the following advantages. Since the address alignment system provides access to many bytes of continued memory cells for any selected address, it results in the improved data transmission efficiency and memory device utilization efficiency. In particular, when the system of the present invention is applied to devices such as a main memory device of CPU having various commands with different lengths, the efficiency of address access operation is increased, thus improving the operation speed and the reliability.

It will be apparent to those skilled in the art that various modifications and variations can be made in the address alignment system for a semiconductor memory device of the present invention without departing from the spirit of scope of the invention. Thus, it is intended that the present invention cover the modifications and variations of this invention provided they come within the scope of the appended claims and their equivalents.

What is claimed is:

1. An address alignment system for a semiconductor memory device comprising:

a plurality of address decoders for decoding a received address, dividing m cells of n bit size into at least two blocks, and individually accessing the m cells on a block basis;

a controlling circuit for producing data input/output selection signals according to the received address;

a plurality of cell selectors connected to cells on the same row of the blocks for selecting cells in any one block in response to the data input/output selection signals produced by the controlling circuit;

a plurality of input/output selectors for selecting one of the cell selectors to re-align data in the order of addresses according to the data input/output selection signal produced by the controlling circuit; and a plurality of input/output ports each connected to one of the plurality of the input/output selectors.

2. The address alignment system as claimed in claim 1, wherein when a second one of the plurality of address decoders accesses cells on a designated row in a last block, a first one of the plurality of address decoders corresponding to a first block accesses cells on a next row.

3. An address alignment system for a semiconductor memory device comprising:

first and second memory cell blocks each having memory cells of byte units having sequentially increasing addresses;

first and second address decoders for decoding a received address and accessing the first and second memory cell blocks, respectively;

a controlling circuit for generating data input/output selection signals S0, S1, S2, S3, SU0, and SU1 in accordance with the received address;

first, second, third, and fourth demultiplexers each having two inputs for selecting cells in the first memory cell block or the second memory cell block in response to the data input/output selection signals S0, S1, S2, S3 generated by the controlling circuit, respectively;

fifth, sixth, seventh, and eighth demultiplexers, each having four inputs, being connected to one of the first, second, third, and fourth demultiplexers in response to the data input/output selection signals SU0 and SU1 generated by the controlling circuit; and first, second, third, and fourth input/output ports connected to the fifth, sixth, seventh, and eighth demultiplexers, respectively for receiving and producing data.

4. The address alignment system as claimed in claim 3, wherein, when the second address decoder accesses cells on a designated row in the second memory cell block, the first address decoder accesses cells on the next row in the first memory cell block.

5. The address alignment system as claimed in claim 3, wherein the fifth, sixth, seventh, and eighth demultiplexers are selectively connected to the first, second, third, and fourth demultiplexers, for selecting memory cell blocks in response to the data input/output selection signals SU0 and SU1 generated by decoding lower bits of the received address.

6. The address alignment system as claimed in claim 3, wherein each of input/output ports is 8 bytes wide.

7. An address alignment system for a memory device having cells grouped into a plurality of blocks, comprising:

an address decoder associated with one of the plurality of blocks for decoding a received address;

a controlling circuit for producing data input/output selection signals according to the received address;

a plurality of cell selectors for selecting cells in any one of the plurality of blocks in response to the data input/output selection signals;

a plurality of input/output selectors for selecting one of the cell selectors to re-align data in the order of addresses according to the data input/output selection signal produced by the controlling circuit; and a plurality of input/output ports each connected to one of the plurality of the input/output selectors.

* * * * *